(12) United States Patent
Yin

(10) Patent No.: US 11,404,669 B2
(45) Date of Patent: Aug. 2, 2022

(54) DISPLAY PANEL AND PREPARATION METHOD THEREOF

(71) Applicant: Wuhan China Star Optoelectronics Semiconductor Display Technology Co., Ltd., Wuhan (CN)

(72) Inventor: Xuebing Yin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 239 days.

(21) Appl. No.: 16/632,565

(22) PCT Filed: Nov. 5, 2019

(86) PCT No.: PCT/CN2019/115613
§ 371 (c)(1),
(2) Date: Jan. 21, 2020

(87) PCT Pub. No.: WO2021/017245
PCT Pub. Date: Feb. 4, 2021

(65) Prior Publication Data
US 2021/0359265 A1    Nov. 18, 2021

(30) Foreign Application Priority Data

Aug. 1, 2019 (CN) .......................... 201910707351.9

(51) Int. Cl.
| H01L 51/52 | (2006.01) |
| H01L 51/56 | (2006.01) |
| H01L 51/00 | (2006.01) |
| H01L 27/32 | (2006.01) |

(52) U.S. Cl.
CPC ........ *H01L 51/5253* (2013.01); *H01L 51/004* (2013.01); *H01L 51/0035* (2013.01); *H01L 51/0094* (2013.01); *H01L 51/56* (2013.01); *H01L 27/3244* (2013.01); *H01L 2227/323* (2013.01)

(58) Field of Classification Search
CPC . H01L 51/5253; H01L 51/0035; H01L 51/56; H01L 27/3244; H01L 51/0094; H01L 51/0004; H01L 51/5221; H01L 27/3276
USPC ..................... 257/72, 40, 79; 438/48, 82, 99
See application file for complete search history.

(56) References Cited

U.S. PATENT DOCUMENTS

| 2004/0041147 A1 | 3/2004 | Park |
| 2018/0212191 A1 | 7/2018 | Jin |
| 2019/0019974 A1 | 1/2019 | Yun et al. |

(Continued)

FOREIGN PATENT DOCUMENTS

| CN | 1487779   | 4/2004 |
| CN | 106384743 | 2/2017 |
| CN | 108258151 | 7/2018 |

*Primary Examiner* — Thinh T Nguyen

(57) ABSTRACT

The present disclosure provides a display panel and a preparation method thereof. The display panel includes a substrate, a thin film transistor, a pixel layer, and a thin film encapsulation layer. Wherein the thin film encapsulation layer includes a first inorganic layer, a first organic layer, and a second organic layer. The preparation method of the display panel includes the following steps: a substrate provision step, a thin film transistor preparation step, a pixel layer preparation step, and a thin film encapsulating layer preparation step.

8 Claims, 2 Drawing Sheets

(56) References Cited

U.S. PATENT DOCUMENTS

| | | | |
|---|---|---|---|
| 2019/0288048 A1* | 9/2019 | Kang et al. | H01L 51/0097 |
| 2019/0326378 A1* | 10/2019 | Kim et al. | H01L 27/3262 |
| 2019/0391691 A1* | 12/2019 | Zhou | H01L 51/5251 |

* cited by examiner

DISPLAY PANEL AND PREPARATION METHOD THEREOF

RELATED APPLICATIONS

This application is a National Phase of PCT Patent Application No. PCT/CN2019/115613 having International filing date of Nov. 5, 2019, which claims the benefit of priority of Chinese Patent Application No. 201910707351.9 filed on Aug. 1, 2019. The contents of the above applications are all incorporated by reference as if fully set forth herein in their entirety.

FIELD AND BACKGROUND OF THE INVENTION

The present disclosure relates to a field of display, and more particularly to a display panel and a preparation method thereof.

The structure of the current mainstream thin film encapsulation layer (TFE) is a five-layer structure stacked by an inorganic layer and an organic layer. As shown in FIG. 1, the thin film encapsulation layer 500 is an entire TFE structure including an inorganic layer 510 and an organic layer 520. The inorganic layer 510 is usually prepared by plasma enhanced chemical vapor deposition (PECVD), and the organic layer 520 is prepared by inkjet printing (IJP). The organic layer 520 undergoing printing and leveling is solidified into a film by using an organic ink, such as an epoxy resin or an acrylic. In order to prevent the presence of surface unevenness of the visible layer, it is required that the organic ink can be well leveled on the TFT substrate.

SUMMARY OF THE INVENTION

Technical problems: The object of the present disclosure is to solve the technical problems that the surface of the inorganic layer of the thin film encapsulation layer is uneven, and the organic layer and the inorganic layer of the thin film encapsulation layer are easily peeled off in the conventional display panel.

Technical solutions: In order to achieve the above object, the present disclosure provides a display panel, comprising: a substrate; a thin film transistor disposed on a surface of one side of the substrate; a pixel layer disposed on a surface of one side of the thin film transistor away from the substrate; and a thin film encapsulation layer disposed on a surface of one side of the pixel layer away from the thin film transistor; wherein the thin film encapsulation layer includes: a first inorganic layer disposed on the surface of said one side of the pixel layer away from the thin film transistor; an organic layer disposed on a surface of one side of the first inorganic layer away from the pixel layer; and a second organic layer disposed on a surface of one side of the first organic layer away from the first inorganic layer.

Further, material of the first organic layer includes hexamethyldisiloxane.

Further, material of the first inorganic layer includes at least one of silicon oxide, silicon nitride, aluminum oxide or silicon oxynitride.

Further, material of the second organic layer includes material of the second organic layer including epoxy resin and/or acryl.

Further, the display panel further includes a buffer layer disposed between the substrate and the thin film transistor.

Further, the thin film transistor includes: an active layer disposed on a surface of one side of the buffer layer away from the substrate; a first gate insulating layer disposed on a surface of one side defined by the active layer and the buffer layer away from the substrate; a first gate layer disposed on a surface of one side of the first gate insulating layer away from the buffer layer and disposed opposite the active layer; and a second gate insulating layer disposed on a surface of one side defined by the first gate layer and the first gate insulating layer away from the buffer layer; a second gate layer disposed on a surface of one side of the second gate insulating layer away from the first gate insulating layer and disposed opposite the first gate layer; a dielectric layer disposed on a surface of one side defined by the second gate layer and the second gate insulating layer away from the first gate insulating layer; a source drain layer disposed on a surface of one side of the dielectric layer away from the second gate insulating layer, and electrically connected to the active layer by passing through the dielectric layer, the second gate insulating layer, and the first gate insulating layer; a planarization layer disposed on a surface of one side defined by the active layer and the dielectric layer away from the second gate insulating layer.

Further, the pixel layer includes: an anode layer disposed on a surface of one side of the planarization layer away from the dielectric layer, and electrically connected to the source drain layer by passing through the planarization layer; a pixel defining layer disposed on a surface of one side defined by the anode layer and the planarization layer away from the dielectric layer; a pixel layer via hole penetrating the pixel defining layer and disposed opposite the anode layer; a light emitting layer disposed in the pixel layer via hole and disposed on a surface of one side of the anode layer away from the planarization layer; and a pixel electrode layer disposed on a surface of one side defined by the pixel defining layer and the light emitting layer away from the anode layer.

Further, the thin film encapsulation layer further includes: a cover layer disposed on a surface of one side of the pixel electrode layer away from the pixel defining layer; a lithium fluoride layer disposed on a surface of one side of the cover layer away from the pixel electrode layer; a spacer protruding from a surface of one side of the lithium fluoride layer away from the cover layer; and a second inorganic layer disposed on a surface of one side of the second organic layer away from the first organic layer.

In order to achieve the above object, the present disclosure further provides a preparation method of a display panel, comprising the steps of: a substrate provision step of providing a substrate; a thin film transistor preparation step of preparing a thin film transistor on an upper surface of the substrate; a pixel layer preparation step of preparing a pixel layer on an upper surface of the thin film transistor; a thin film encapsulation layer preparation step of preparing a thin film encapsulation layer on the upper surface of the pixel layer; wherein the thin film encapsulation layer preparation step includes: a first inorganic layer preparation step of preparing a first inorganic layer on an upper surface of the pixel layer; a first organic layer preparation step of preparing a first organic layer on an upper surface of the first inorganic layer; and a second organic layer preparation step of preparing a second organic layer on the upper surface of the first organic layer.

Further, in the first organic layer preparation step, hexamethyldisiloxane is deposited on the upper surface of the first inorganic layer by vapor deposition to form the first organic layer.

Beneficial effect: The technical effect of the present disclosure is that a uniform first organic layer is formed on the surface of the first inorganic layer, an organic material is sprayed onto the surface of the first organic layer, and the second organic layer is formed after the organic material is leveled. The first organic layer is hexamethyldisiloxane having efficient conformability. Therefore, the organic material is easily leveled on the surface of the first organic layer, and only a small amount of organic material is needed to entirely cover the first organic layer. The thickness of the second organic layer can be greatly reduced, compared to the prior art, thereby reducing the thickness of the display panel. Meanwhile, the hexamethyldisiloxane can be used as a binder to enhance the adhesion between the first inorganic layer and the second organic layer to prevent separation between the first inorganic layer and the second organic layer, thereby further prolonging the life span of the display panel.

Figure 1:
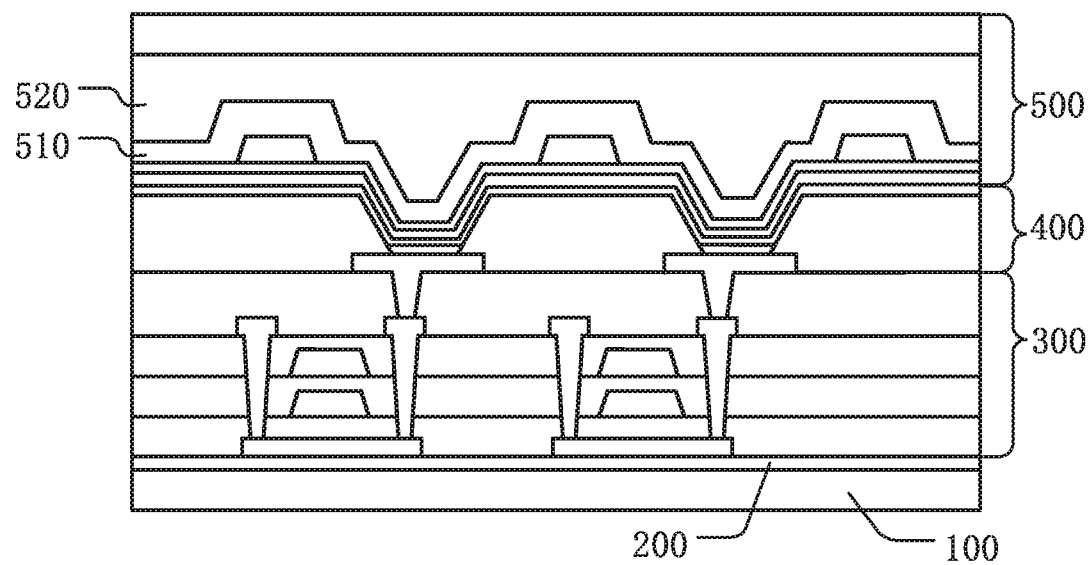
FIG. 1 is a cross-sectional view of a display panel in the prior art.

Some Components are Labeled as Follows:

100, substrate; 200, buffer layer; 300, thin film transistor; 400, pixel layer; 500, thin film encapsulation layer;

1, substrate; 2, buffer layer; 3, thin film transistor; 4, pixel layer; 5, thin film encapsulation layer;

31, active layer; 32, first gate insulating layer; 33, first gate layer; 34, second gate insulating layer;

35, second gate layer; 36, dielectric layer; 37, source drain layer; 38, planarization layer;

41, anode layer; 42, pixel defining layer; 43, light emitting layer; 44, pixel electrode layer;

51, cover layer; 52, lithium fluoride layer; 53, spacer; 54, first inorganic layer; 55, first organic layer; 56, second organic layer; 57, second inorganic layer.

DETAILED DESCRIPTION OF SPECIFIC THE PREFERRED EMBODIMENTS OF THE INVENTION

The preferred embodiments of the present disclosure are described in detail below with reference to the accompanying drawings, so as to fully introduce the technical contents of the present disclosure to those skilled in the art, and to exemplify that the present disclosure can be implemented, such that the technical contents of the present disclosure are more clear, and those skilled in the art more readily understand how to implement the disclosure. However, the present disclosure may be embodied in many different forms of embodiments, and the scope of the present disclosure is not limited to the embodiments described herein. The description of the embodiments below is not intended to limit the scope of the present disclosure.

The directional terms mentioned in the present disclosure, such as "upper", "lower", "front", "back", "left", "right", "inside", "outside", "side", etc. are only direction with regard to the accompanying drawings. The directional terms herein used for explaining and illustrating the present disclosure are not intended to limit the scope of present disclosure.

In the drawings, structurally identical components are denoted by the same reference numerals, and structural or functionally similar components are denoted by similar reference numerals. Moreover, the size and thickness of each component shown in the drawings are arbitrarily illustrated for ease of understanding and description. The present disclosure does not limit the size and thickness of each component.

When a component is described as "on" another component, the component can be placed directly on the other component. There can also be an intermediate component which the component is placed thereon, and the intermediate component is placed on another component. When a component is described as "mounted to" or "connected to" another component, they can be understood as directly "mounted to" or "connected to", or a component is "mounted to" or "connected to" another component through an intermediate component.

Figure 2:
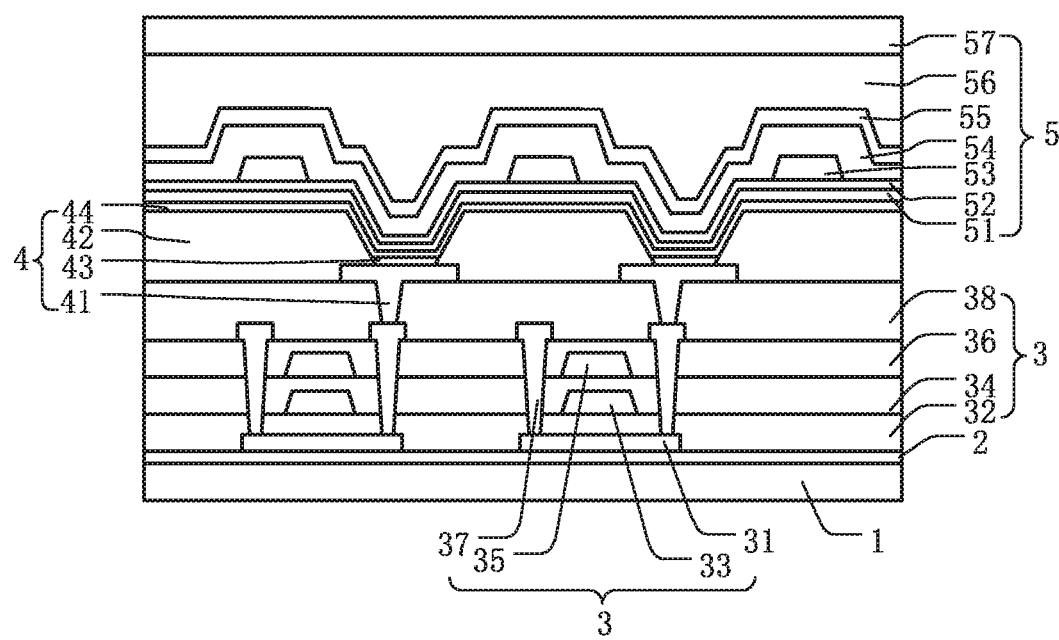
FIG. 2 is a cross-sectional view of a display panel according to an embodiment of the present disclosure.

As shown in FIG. 2, the embodiment provides a display panel including a substrate 1, a buffer layer 2, a thin film transistor 3, a pixel layer 4, and a thin film encapsulation layer 5.

The substrate 1 is a flexible substrate and has a function for blocking water and oxygen. The substrate 1 can have desirable capacity on anti-impact and can effectively protect the display panel. Material of the substrate 1 includes one or more of glass, silica, polyethylene, polypropylene, polystyrene, polylactic acid, polyethylene terephthalate, polyimide or polyurethane.

The buffer layer 2 is disposed on an upper surface of the substrate 1, and the buffer layer 2 takes a buffering effect. Material of the buffer layer 2 is silicon dioxide ($SiO_2$) or silicon nitride (SiNx). The buffer layer 2 may be a single layer of SiO2 layer, or a multilayer of stacked silicon dioxide ($SiO_2$) or silicon nitride (SiNx). The silicon dioxide ($SiO_2$) layer is disposed on the top layer.

The thin film transistor 3 is disposed on an upper surface of the buffer layer 2, for controlling electronic conversion of the pixel and providing circuit support for the display panel. The thin film transistor 3 includes an active layer 31, a first gate insulating layer 32, a first gate layer 33, a second gate insulating layer 34, a second gate layer 35, a dielectric layer 36, a source drain layer 37 and a planarization layer.

The active layer 31 is disposed on an upper surface of the buffer layer 2. Material of the active layer 31 is an oxide semiconductor, such as indium gallium zinc oxide IGZO, and its thickness ranges from 300 A to 500 A (angstrom). In the embodiment, the thickness of the active layer 31 is preferably 400 A (angstrom).

The first gate insulating layer 32 is disposed on an upper surface defined by the active layer 31 and the buffer layer 2. The first gate insulating layer 32 takes an insulating effect to prevent a short circuit problem inside the thin film transistor 3. The first gate insulating layer 32 may be a single layer of SiO2 layer or a multilayer of stacked silicon dioxide ($SiO_2$) or silicon nitride (SiNx). The silicon dioxide ($SiO_2$) layer is disposed on the bottom layer.

The first gate layer 33 is disposed on an upper surface of the first gate insulating layer 32 and disposed opposite the active layer 31. The active layer disposed directly under the first gate layer 33 retains semiconductor characteristics. Material of the first gate layer 33 is metal, such as copper (Cu) or molybdenum (Mo).

The second gate insulating layer 34 is disposed on an upper surface defined by the first gate insulating layer 32 and the first gate layer 33. The second gate insulating layer 34 takes an insulating effect to prevent a short circuit problem inside the thin film transistor 3. The second gate insulating layer 34 may be a single layer of SiO2 layer or a multilayer of stacked silicon dioxide (SiO2) or silicon nitride (SiNx). The silicon dioxide ($SiO_2$) layer is disposed on the bottom layer.

The second gate layer 35 is disposed on an upper surface of the second gate insulating layer 34 and disposed opposite the first gate layer 33. Material of the second gate layer 35 is metal, such as copper (Cu) or molybdenum (Mo).

The dielectric layer 36 is disposed on an upper surface defined by the second gate layer 35 and the second gate insulating layer 34. Two or more dielectric layer via holes are disposed on the dielectric layer 36. The dielectric layer via holes pass through the dielectric layer 36 and are disposed opposite the active layer 31, to provide a channel for the subsequent source drain layer 37.

The source drain layers 37 is disposed on an upper surface of the dielectric layer 36, disposed in the dielectric layer via holes and electrically connected to the active layer 31 to form an electrical connection between the source drain layers 37 and the active layer 31. Material of the source drain layer 37 is metal.

The planarization layer 38 is disposed on an upper surface defined by the source drain layers 37 and the dielectric layer 36. The planarization layer 38 functions to protect the underlying layers. A planarization layer via hole is defined by the planarization layer 38. The planarization layer via hole passes through the planarization layer 38 and is disposed opposite the source drain layers 37 to provide a path of electrical connection for a subsequent pixel layer.

The pixel layer 4 is disposed on an upper surface of the thin film transistor layer 3 and can be used to emit light. The pixel layer 4 includes an anode layer 41, a pixel defining layer 42, a light emitting layer 43, and a pixel electrode layer 44.

The anode layer 41 is disposed on an upper surface of the planarization layer 38 and disposed opposite the source drain layers 37. The anode layer 41 passes through the planarization layer via hole and is electrically connected to the source drain layers 37. The anode layer can obtain electrical signals from the thin film transistor 3 and provide the electrical signals for illumination of the light emitting layer 43.

The pixel defining layer 42 is disposed on an upper surface defined by the planarization layer 38 and the anode layer 41, for defining a size of the light emitting layer. A pixel layer via hole is disposed on the pixel defining layer 42. The pixel layer via hole passes through the pixel defining layer 42 and is disposed opposite the anode layer 41.

The light emitting layer 43 is disposed in the pixel layer via hole and disposed on an upper surface of the anode layer 41. After the thin film transistor 3 is turned on, the light-emitting layer 43 emits light after receiving an electric signal from the anode layer 41. Material of the light-emitting layer 43 may be organic light-emitting material.

The pixel electrode layer 44 is disposed on an upper surface defined by the pixel defining layer 42 and the light emitting layer 43. Material of the pixel electrode layer 44 is indium tin oxide ITO. An electrically conducted path is formed between the pixel electrode layer 44 and the light-emitting layer 4.

The thin film encapsulation layer 5 is disposed on an upper surface of the pixel layer 4, for blocking water and oxygen, and functions to protect the pixel layer 4 and the thin film transistor 3. The thickness of the thin film encapsulation layer 5 ranges from 100 nm to 10 μm. The thin film encapsulation layer 5 includes a cover layer 51, a lithium fluoride layer 52, a spacer 53, a first inorganic layer 54, a first organic layer 55, a second organic layer 56 and the second inorganic layer 57.

The cover layer 51 is disposed on an upper surface of the pixel electrode layer 44. The lithium fluoride layer 52 is disposed on an upper surface of the cover layer 51. The spacer 53 protrudes from an upper surface of the lithium fluoride layer 52 and takes a supporting effect.

The first inorganic layer 54 is disposed on an upper surface defined by the lithium fluoride layer 52 and the spacer 53, and elevated from the spacer 53. Material of the first inorganic layer 54 is at least one of silicon oxide, silicon nitride, aluminum oxide, and silicon oxynitride.

The first organic layer 55 is disposed on an upper surface of the first inorganic layer 54. Material of the first organic layer 55 is hexamethyldisiloxane (HMDSO).

The second organic layer 56 is disposed on an upper surface of the first organic layer 55. Material of the second organic layer 56 is at least one of epoxy resin, polyethylene, polypropylene, polystyrene, polylactic acid, polyethylene terephthalate, polyimide, polyurethane, and acrylic.

The material of the first organic layer 55 is hexamethyldisiloxane having effective conformability. Therefore, the organic material is easily leveled on the surface of the first organic layer 55, and only a small amount of organic material is required to entirely cover the first organic layer 55. The thickness of the thin film encapsulation layer in the prior art ranges from 200 nm to 20 μm and in the embodiment can range from 100 nm to 10 μm. The thickness of the second organic layer 56 can be greatly reduced, thereby reducing the thickness of the display panel.

The second inorganic layer 57 is disposed on an upper surface of the second organic layer 56. Material of the second inorganic layer 56 is at least one of silicon oxide, silicon nitride, aluminum oxide, and silicon oxynitride.

The technical effect of the display panel of the embodiment is that a uniform first organic layer is formed on the surface of the first inorganic layer, the organic material is sprayed on the surface of the first organic layer, and the second organic layer is formed after the organic material is leveled. The first organic layer is hexamethyldisiloxane having efficient conformability. Therefore, the organic material is easily leveled on the surface of the first organic layer, and only a small amount of organic material is needed to entirely cover the first organic layer. The thickness of the second organic layer can be greatly reduced compared to the prior art, thereby reducing the thickness of the display panel. Meanwhile, the hexamethyldisiloxane can be used as a binder to enhance adhesion between the first inorganic layer and the second organic layer, and prevent the first inorganic layer and the second organic layer from separation, thereby further prolonging the life span of the display panel.

Figure 3:
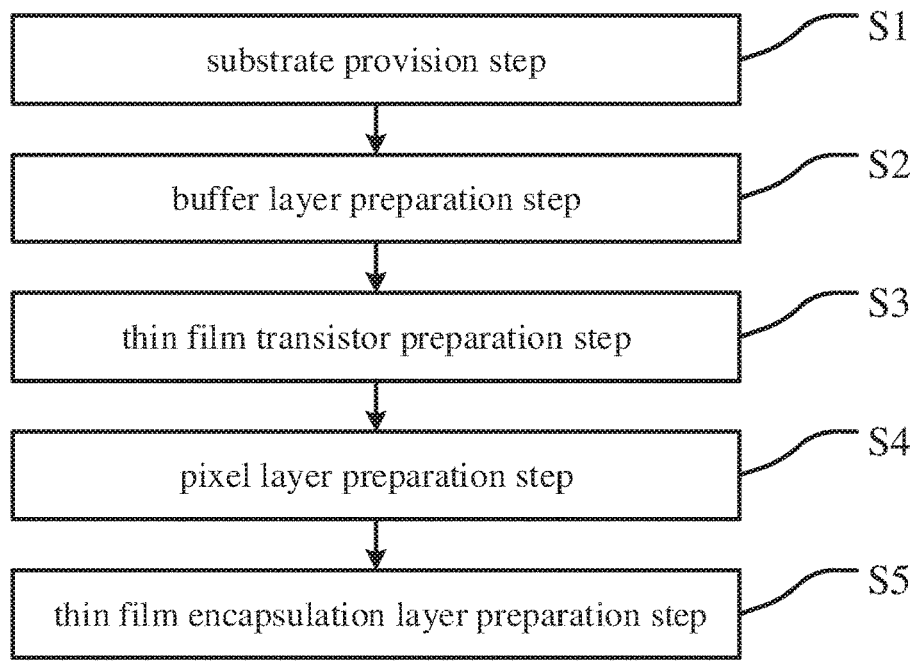
FIG. 3 is a flowchart of a preparation method of a display panel according to an embodiment of the present disclosure.

As shown in FIG. 3, the embodiment further provides a preparation method of a display panel including steps S1 to S5.

S1: A substrate provision step of providing a substrate. The substrate is a flexible substrate and has a function for blocking water and oxygen. The substrate has desirable capacity on anti-impact and can effectively protect the display panel.

S2: A buffer layer preparation step of preparing a buffer layer on the upper surface of the substrate 1. The buffer layer takes a buffering effect. Material of the buffer layer is silicon dioxide (SiO$_2$) or silicon nitride (SiNx). The buffer layer may be a single layer of SiO$_2$ layer, or a multilayer of stacked silicon dioxide (SiO$_2$) or silicon nitride (SiNx). The silicon dioxide (SiO$_2$) layer is disposed on a top layer.

S3: A thin film transistor preparing step of sequentially preparing an active layer, a first gate insulating layer, a first gate layer, a second gate insulating layer, a second gate layer, a dielectric layer, a source drain layer and a planarization layer on an upper surface of the buffer layer to form the thin film transistor. The thin film transistor is used for controlling electronic conversion of the pixel and providing circuit support for the display panel. The thin film transistor 3 includes.

S4: A pixel layer preparation step of sequentially preparing an anode layer, a pixel defining layer, a light emitting layer and a pixel electrode layer on an upper surface of the thin film transistor layer to form a pixel layer. The pixel layer can be used to emit light.

S5: A film encapsulation layer preparation step of preparing a thin film encapsulation layer on an upper surface of the pixel layer. The thin film encapsulation layer is used for blocking water and oxygen and functions to protect the pixel layer and the thin film transistor.

Figure 4:
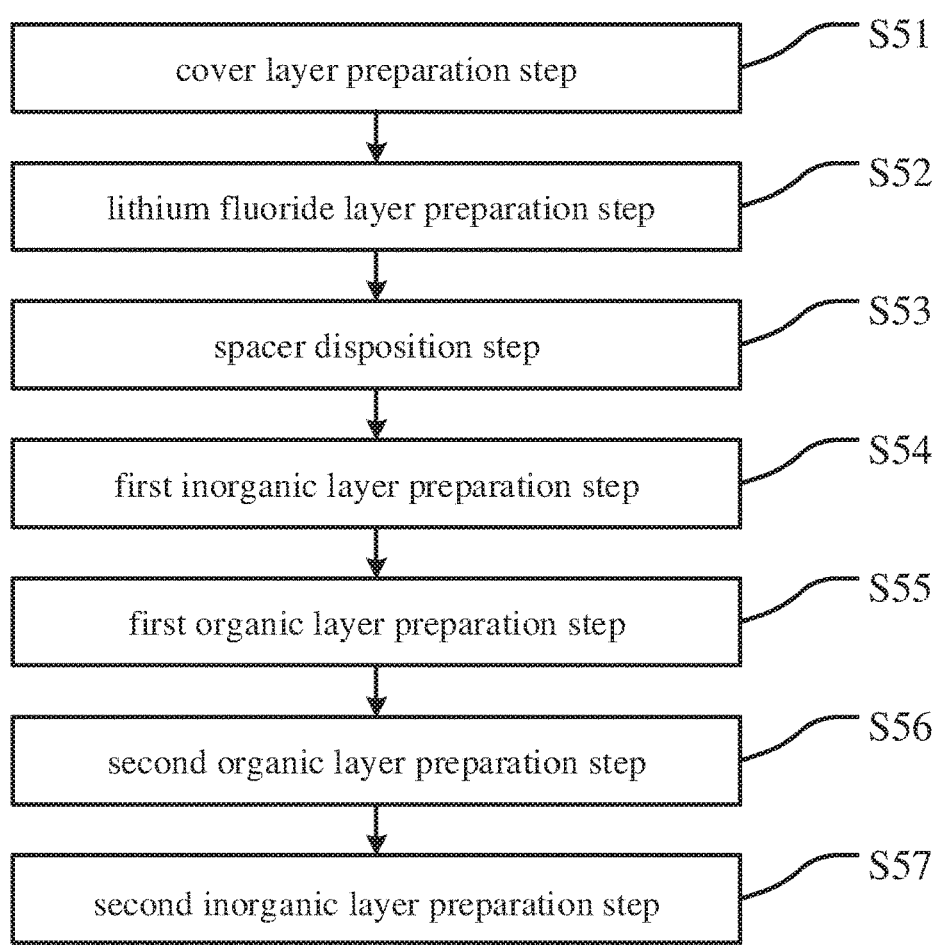
FIG. 4 is a flow chart showing the preparation steps of a thin film encapsulation layer according to an embodiment of the present disclosure.

As shown in FIG. 4, the thin film encapsulation layer preparation step includes steps S51 to S57.

S51: A cover layer preparation step of preparing a cover layer on an upper surface of the pixel electrode layer.

S52: A lithium fluoride layer preparation step of preparing a lithium fluoride layer on an upper surface of the cover layer.

S53: A spacer disposition step of disposing a spacer on an upper surface of the lithium fluoride layer. The spacer protrudes from the upper surface of the lithium fluoride layer 52 and takes a supporting effect.

S54: A first inorganic layer preparation step of depositing inorganic material on an upper surface defined by the lithium fluoride layer and the spacer by plasma enhanced chemical vapor deposition (PECVD) to form the first inorganic layer. The inorganic material includes at least one of silicon oxide, silicon nitride, aluminum oxide, and silicon oxynitride.

S55: A first organic layer preparation step of depositing organic material on the upper surface of the first inorganic layer by plasma enhanced chemical vapor deposition (PECVD) to form the first organic layer. The organic material includes hexamethyldisiloxane (HMDSO).

S56: A second organic layer preparation step of spraying at least one of epoxy resin, polyethylene, polypropylene, polystyrene, polylactic acid, polyethylene terephthalate, polyimide, polyurethane, and acrylic on an upper surface of the first organic layer by using inkjet printing technology to form the second organic layer.

A uniform first organic layer is formed on a surface of the first inorganic layer. The organic material is sprayed on the surface of the first organic layer, and a second organic layer is formed after the organic material is leveled. The first organic layer is hexamethyldisiloxane having effective conformability. Therefore, the organic material is easily leveled on the surface of the first organic layer, and only a small amount of organic material is needed to entirely cover the first organic layer. The thickness of the second organic layer can be greatly reduced compared to the prior art, thereby reducing the thickness of the display panel. Meanwhile, the hexamethyldisiloxane can be used as a binder to enhance adhesion between the first inorganic layer and the second organic layer to prevent the first inorganic layer and the second organic from separation, thereby further prolonging the life span of the display panel.

S57: A second inorganic layer preparation step of depositing the inorganic material on an upper surface of the second organic layer by vapor deposition (PECVD) to form the second inorganic layer. The inorganic material includes at least one of silicon oxide, silicon nitride, aluminum oxide and silicon oxynitride.

The technical effect of the preparation method of the display panel of the embodiment is that the uniform first organic layer is formed on the surface of the first inorganic layer, the organic material is sprayed on the surface of the first organic layer, and the second organic layer is formed after the organic material is leveled. The first organic layer is hexamethyldisiloxane having efficient conformability. Therefore, the organic material is easily leveled on the surface of the first organic layer, and only a small amount of organic material is needed to entirely cover the first organic layer. The thickness of the second organic layer can be greatly reduced compared to the prior art, thereby reducing the thickness of the display panel. Meanwhile, the hexamethyldisiloxane can be used as a binder to enhance the adhesion between the first inorganic layer and the second organic layer to prevent the first inorganic layer and the second organic from separation, thereby further prolonging the life span of the display panel.

The above description is only a preferred embodiment of the present disclosure, and it should be noted that those skilled in the art can also make several improvements and retouches without departing from the principles of the present disclosure. These improvements and retouches should also be considered as the protection scope of the present disclosure.

What is claimed is:

1. A display panel, comprising:
a substrate;
a thin film transistor disposed on a surface of one side of the substrate;
a pixel layer disposed on a surface of one side of the thin film transistor away from the substrate; and
a thin film encapsulation layer disposed on a surface of one side of the pixel layer away from the thin film transistor;
wherein the thin film encapsulation layer comprises:
a cover layer disposed on an upper surface of the pixel electrode layer;
a lithium fluoride layer disposed on an upper surface of the cover layer;
a spacer protruding from an upper surface of the lithium fluoride layer;
a first inorganic layer directly disposed on an upper surface defined by the lithium fluoride layer and the spacer, and elevated from the spacer;
a first organic layer disposed on a surface of one side of the first inorganic layer away from the pixel layer;
a second organic layer disposed on a surface of one side of the first organic layer away from the first inorganic layer, wherein the first organic layer is disposed between the first inorganic layer and the second organic layer.

2. The display panel as claimed in claim 1, wherein material of the first organic layer includes hexamethyldisiloxane.

3. The display panel as claimed in claim 1, wherein material of the first inorganic layer includes at least one of silicon oxide, silicon nitride, aluminum oxide, or silicon oxynitride.

4. The display panel as claimed in claim 1, wherein material of the second organic layer includes epoxy resin and/or acrylic.

5. The display panel as claimed in claim 4, further comprising a buffer layer, disposed between the substrate and the thin film transistor.

6. The display panel as claimed in claim 1, wherein the thin film transistor includes:
- an active layer disposed on a surface of one side of the buffer layer away from the substrate;
- a first gate insulating layer disposed on a surface of one side defined by the active layer and the buffer layer away from the substrate;
- a first gate layer disposed on a surface of one side of the first gate insulating layer away from the buffer layer and disposed opposite the active layer;
- a second gate insulating layer disposed on a surface of one side defined by the first gate layer and the first gate insulating layer away from the buffer layer;
- a second gate layer disposed on a surface of one side of the second gate insulating layer away from the first gate insulating layer and disposed opposite the first gate layer;
- a dielectric layer disposed on a surface of one side defined by the second gate layer and the second gate insulating layer away from the first gate insulating layer;
- a source drain layer disposed on a surface of one side of the dielectric layer away from the second gate insulating layer, and electrically connected to the active layer by passing through the dielectric layer, the second gate insulating layer, and the first gate insulating layer;
- a planarization layer disposed on a surface of one side defined by the active layer and the dielectric layer away from the second gate insulating layer.

7. The display panel as claimed in claim 6, wherein the pixel layer includes:
- an anode layer disposed on a surface of one side of the planarization layer away from the dielectric layer, and electrically connected to the source drain layer by passing through the planarization layer;
- a pixel defining layer disposed on a surface of one side defined by the anode layer and the planarization layer away from the dielectric layer;
- a pixel layer via hole penetrating the pixel defining layer and disposed opposite the anode layer;
- a light emitting layer disposed in the pixel layer via hole and disposed on a surface of one side of the anode layer away from the planarization layer; and
- a pixel electrode layer disposed on a surface of one side defined by the pixel defining layer and the light emitting layer away from the anode layer.

8. The display panel as claimed in claim 7, wherein the thin film encapsulation layer further includes
a second inorganic layer disposed on a surface of one side of the second organic layer away from the first organic layer.

* * * * *